United States Patent [19]

Shinohara et al.

[11] Patent Number: 5,041,803

[45] Date of Patent: Aug. 20, 1991

[54] AUTOMATIC LOAD MATCHING CIRCUIT FOR MICROWAVES USING MULTI-ELEMENT MATCHING DEVICE

[75] Inventors: Kibatsu Shinohara; Hiroshi Hasunuma, both of Yokohama, Japan

[73] Assignee: Nihon Koshuha Co., Ltd., Japan

[21] Appl. No.: 497,001

[22] Filed: Mar. 21, 1990

[30] Foreign Application Priority Data

Mar. 22, 1989 [JP] Japan .................................. 1-70232

[51] Int. Cl.⁵ ............................................. H03H 7/40
[52] U.S. Cl. ..................................... 333/17.3; 333/35; 333/263
[58] Field of Search ........................ 333/17.1, 17.3, 35, 333/263; 455/123-125

[56] References Cited

U.S. PATENT DOCUMENTS

| | | | |
|---|---|---|---|
| 2,438,912 | 4/1948 | Hansen et al. .................... | 333/35 X |
| 2,941,169 | 6/1960 | Weinschel ........................ | 333/35 X |
| 4,311,972 | 1/1982 | Landt et al. ..................... | 333/17.3 |
| 4,485,360 | 11/1984 | Seward ............................. | 333/17.3 |

FOREIGN PATENT DOCUMENTS

| | | | |
|---|---|---|---|
| 980870 | 5/1951 | France ............................. | 333/17.3 |
| 15502 | 1/1988 | Japan ............................... | 333/17.3 |

*Primary Examiner*—Eugene R. Laroche
*Assistant Examiner*—Benny Lee
*Attorney, Agent, or Firm*—Finnegan, Henderson, Farabow, Garrett & Dunner

[57] ABSTRACT

An automatic load-matching circuit for microwaves, disposed on a transmission line between a signal source and a load. Signal detection means for detecting a travelling wave component and a reflected wave component and for producing outputs corresponding to the absolute value of reflection coefficient $\Gamma$, the cosine products $|\Gamma|\cos\theta$, and the sine product $|\Gamma|\sin\theta$ for controlling an automatic matching means, which includes three matching elements, each having an adjustable short-circuit length, disposed on the transmission line with a separation of odd number multiples of $\frac{1}{8}$ of a wavelength along the transmission line. The first and third matching elements are connected such that in response to a change in the short-circulating length of one of the first and third matching elements, the short-circuiting length of the other of the first and third matching elements changes in a corresponding opposite manner. The first and third matching elements are both driven by either the cosine product output or the sine product output, and the second matching element is driven with the one of the cosine and sine product outputs which is not driving the first and third matching elements.

3 Claims, 7 Drawing Sheets

AUTOMATIC LOAD MATCHING CIRCUIT FOR MICROWAVES USING MULTI-ELEMENT MATCHING DEVICE

BACKGROUND OF THE INVENTION a) Field of the Invention

The present invention relates to an automatic load matching circuit for microwaves in various transmission lines such as, for example, waveguides, coaxial tubes, and so forth. More particularly, it is concerned with an automatic load matching circuit for microwaves using a multi-element matching device.

b) Description of Prior Arts

Industries require a particularly stable source of energy for the sake of the best possible quality control of their products. Adoption of microwave power as the source of energy in various industrial facilities exhibits, in many cases, a special effect in comparison with adoption of other sources of energy, hence its effective utilization has been much expected. Such microwave electric power, however, has a very wide range of fluctuations, and yet its fluctuations often take place abruptly. It has been particularly desirable that such microwave power be supplied stably during operation of the production facilities to achieve the best quality control, for which the so-called "load-matching" has been carried out.

Heretofore, the load-matching in the microwave band has been done by manual operations of three or more stubmatching devices, E/H matching devices, and so on, while monitoring the travelling wave power to a load as well as the reflected power from the load, to thereby adjust the load to the maximum point of the travelling wave power with the minimum reflected power.

With the manual load-matching operation as described above, however, it is necessary that such fluctuations in the load constantly be monitored so as to effect prompt operation in response to the fluctuations, hence such quick and accurate response to the abrupt fluctuations in the load is very difficult. Due to this difficulty, there has been a problem in the quality control such that delay occurs in taking appropriate response at the abrupt change in the load conditions.

In view of this, the present inventor has previously proposed an automatic load-matching circuit for microwaves which carries out automatic load-matching as mentioned above, as disclosed in published Japanese Patent Document No. 63-15502 with which the intended purpose has been met for the time being, although there still remained a difficulty, among others in that a zone of no matching still existed.

After the abovementioned proposal on the automatic load-matching circuit for microwaves, there followed improved circuits, in which E/H matching devices were utilized as disclosed in published Japanese Patent Document No. 63-264892 and No. 63-264893. These circuits, however, also had a disadvantage in that the circuit construction was somewhat complicated.

SUMMARY OF THE INVENTION

The present invention has been made in view of the above circumstances and has as an object to provide a further improved load-matching circuit which is capable of solving the abovementioned problems, and also capable of achieving the automatic load-matching even at the time of abrupt change in the load, thereby making it possible to achieve a stable power supply at all times and realize the effective quality control of products.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the automatic load-matching circuit for microwaves, disposed on a transmission line between a signal source and a load, of this invention, comprises signal detection means for detecting a wave component traveling into the automatic load-matching circuit toward the load, for detecting a wave component reflected from the load having a reflection coefficient $\Gamma$ and deflection angle $\theta$, and for producing outputs corresponding to the absolute value of reflection coefficient $\Gamma$, a cosine product $|\Gamma| \cos \theta$, and a sine product $|\Gamma| \sin \theta$. The outputs of the signal detection means control an automatic matching means, including three matching elements, each having an adjustable short-circuiting length, disposed on the transmission line such that distances corresponding to odd number multiples of ⅛ of a wavelength along the transmission line separate the matching elements from each other. A second of the matching elements is disposed between a first and a third of the matching elements. The first and third matching elements are connected such that in response to a change in the short-circuiting length of one of the first and third matching elements, the short-circuiting length of the other of the first and third matching elements changes in a corresponding opposite manner. The first and third matching elements are both driven by either the cosine product output or the sine product output, and the second matching element is driven with the one of the cosine and sine product outputs not driving the first and third matching elements.

In a second type of automatic load-matching circuit for microwaves, the automatic matching means controlled by the outputs of the signal detection means includes two or more pairs of matching elements. The matching elements of each pair are disposed on the transmission line such that distances corresponding to odd number multiples of about ¼ of a wavelength along the transmission line separate the matching elements in each pair, and each of the matching elements has an adjustable short-circuiting length. Each pair of matching elements is connected such that in response to a change in the short-circuiting length of one of the matching elements in a pair, the short-circuiting length of the other matching element in that pair changes in a corresponding opposite manner. The two or more pairs of matching elements are disposed on the transmission line such that distances corresponding to odd number multiples of about ⅛ of a wavelength along the transmission line separate the nearest matching elements in adjacent pairs. One of the pairs of matching elements is driven by the cosine product output and the other of the pairs is driven by the sine product output.

In a third type of automatic load-matching circuit for microwaves, the automatic matching means controlled by the outputs of the signal detection means includes a pair of matching elements disposed on the transmission line such that a distance corresponding to an odd number multiple of approximately ¼ of a wavelength along the transmission line separates the matching elements of the pair from each other. The matching elements, each having a short-circuiting length, are connected in such a manner that in response to a change in the short-circuiting length of one of the matching elements in the pair, the short-circuiting length of the other matching element in the pair changes in a corresponding opposite manner. A third matching element is disposed on the transmission line between the pair and the load at a distance from the nearest matching element of the pair corresponding to an odd number multiple of ⅛ of a wavelength along the transmission line. The pair of matching elements is driven by the sine or cosine product output and the third matching element is driven by the sine or cosine product output not driving the pair.

DETAILED DESCRIPTION OF PREFERRED EMBODIMENTS

In the following, the present invention will be described with reference to its preferred emboidments as shown in the accompanying drawings.

According to the present invention, it is possible to carry out the automatic matching by first obtaining, in a detection circuit, a cosine product ($|\Gamma| \cos \theta$) and a sine product ($|\Gamma| \sin \theta$) on the basis of a reflection coefficient vector $\Gamma$ of a load and its deflection angle $\theta$, and then driving a motor, etc. of matching elements in each of the abovementioned matching device with both cosine and sine products as the drive voltages.

For extracting the reflection coefficient of a load, there are various ways such as use of a multi-probe method, a directive coupling circuit, and so forth. In this particular embodiment of the present invention, explanations will be given for this extraction by a four-probe method as an example. This method was used as a direct viewing device for impedance measurement, for which a reference may be had, for example, to "Measurement of Micro-wave & Millimeterwave", co-authored by Bun-Ichi Oguchi and Masamitsu Ohta, published from K. K. Corona, pp. 84~86. Of various kinds of methods as described in this reference literature, the fourprobe method as shown in FIG. 1 thereof is adopted for the purpose of the embodiment according to the present invention.

In the ensuing examples, explanations will be given with a rectangular waveguide as a transmission line, as one embodiment of the present invention, although a similar resulting effect will be obtainable with use of a coaxial tube line, and others.

Figure 1:
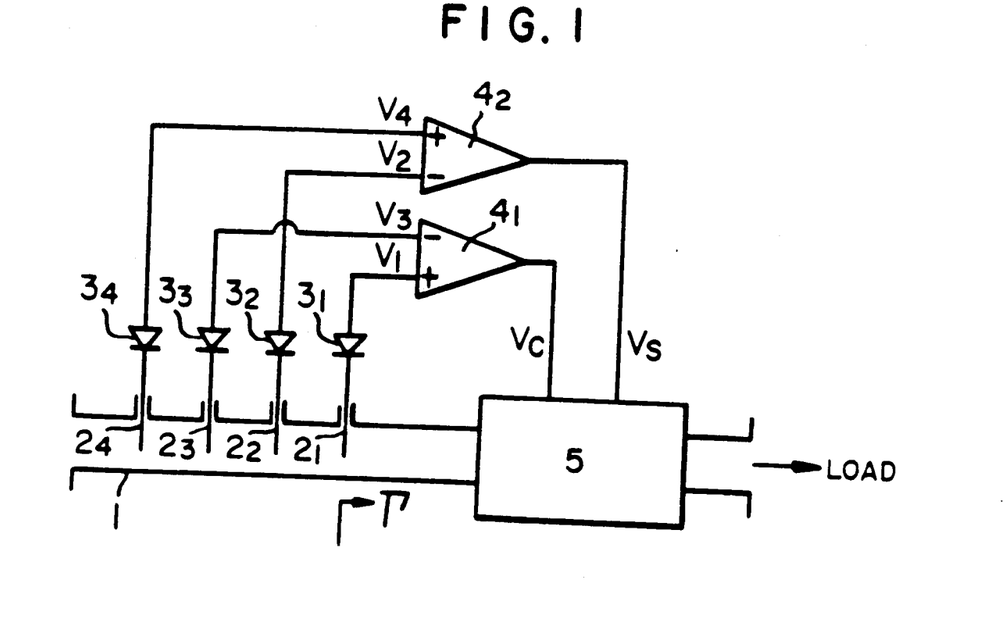
FIG. 1 is a schematic circuit diagram for explaining one example of a control voltage detection circuit, wherein a four-probe method is adopted.

In FIG. 1, a reference numeral 1 designates a rectangular waveguide, along which four probes $2_1$, $2_2$, $2_3$ and $2_4$ are disposed at a space interval corresponding to ⅛ of a wavelength in the waveguide. To the output sides of these probes, there are respectively connected wave detectors $3_1$, $3_2$, $3_3$ and $3_4$. Assuming that the wave detection characteristics are the square-law characteristics, each output voltage $V_1$, $V_2$, $V_3$, $V_4$, can be expressed in the following equations, with the wave detection sensitivity being K; the amplitude of incident wave being Vi; and the reflection coefficient of the load including a matching device 5, as viewed from the probe $2_1$, being $|\Gamma| \exp(j\theta)$:

$$V_1 = K|Vi|^2 (1 + |\Gamma|^2 + 2|\Gamma| \cos \theta)$$
$$V_2 = K|Vi|^2 (1 + |\Gamma|^2 - 2|\Gamma| \sin \theta)$$
$$V_3 = K|Vi|^2 (1 + |\Gamma|^2 - 2|\Gamma| \cos \theta)$$
$$V_4 = K|Vi|^2 (1 + |\Gamma|^2 + 2|\Gamma| \sin \theta)$$

When $V_1$ and $V_3$ are imparted to the input terminals of a differential amplifier $4_1$, and $V_2$ and $V_4$ are applied to the input terminals of a differential amplifier $4_2$, outputs from both differential amplifiers $4_1$ and $4_2$, Vc and Vs respectively, are expressed by the following equations.

$$V_c = V_1 V_3 = 4K|Vi|^2 |\Gamma| \cos \theta$$

$$V_s = V_4 - V_2 = 4K|Vi|^2 |\Gamma| \sin \theta$$

From the above equations, it will be seen that the outputs are proportionate to the cosine product Vc and the sine product Vs. These outputs are applied, as the drive voltage, to the two sets of matching elements in the matching device 5, thereby performing the automatic matching.

Figure 4:
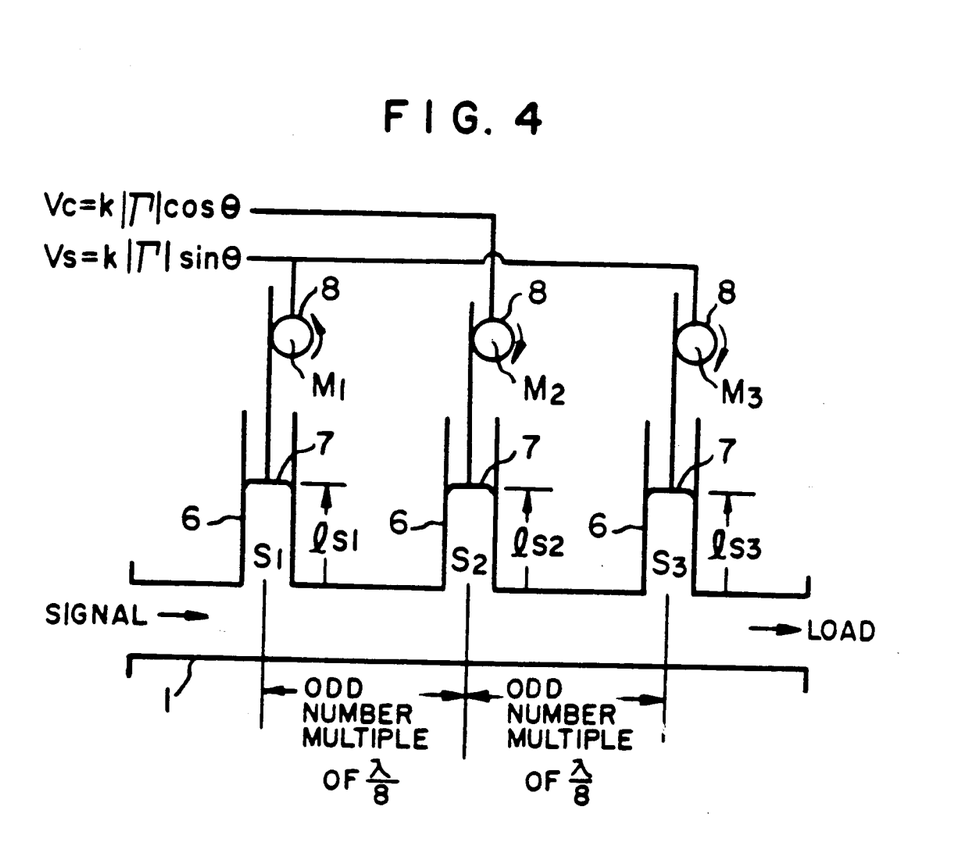
FIG. 4 is a schematic circuit diagram for explaining the first type matching device according to the present invention.

The matching element is constructed so, in FIG. 4, short-plunger (short-circuiting device) 7 is incorporated in, for example, a serially branched waveguide provided on the broad surface of the rectangular waveguide, or in a parallel branched waveguide 6 provided in the narrow surface of the rectangular waveguide, and this short-plunger is shifted by an external electric motor 8.

Figure 2:
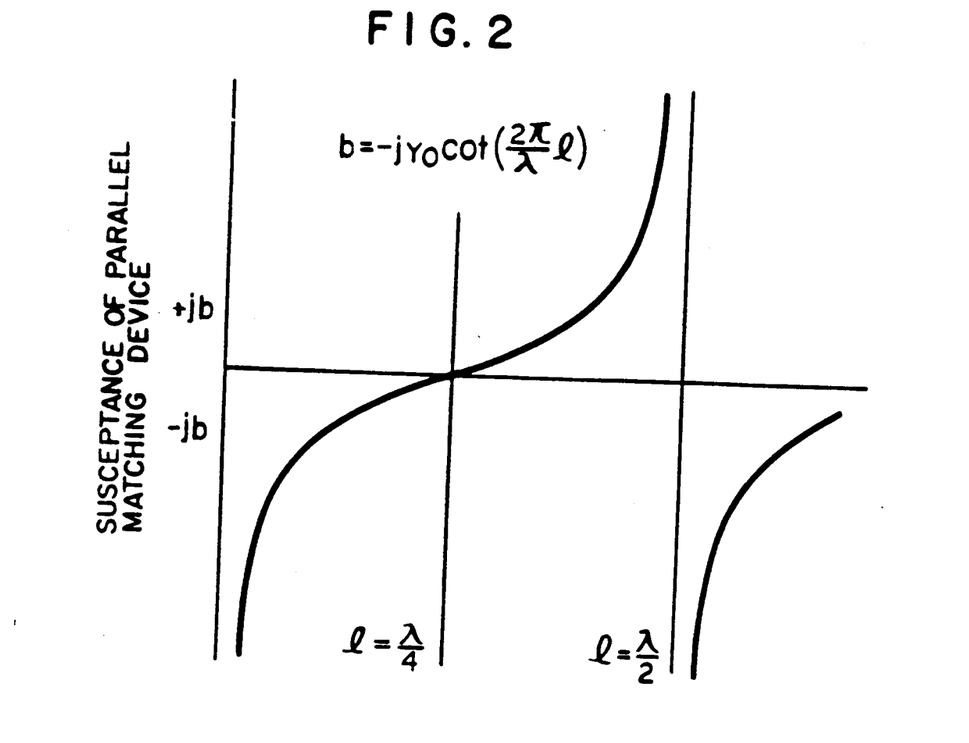
FIG. 2 is a graphical representation showing susceptance variation characteristics of a parallel type matching device, on the basis of changes in the short-circuiting length.

FIG. 2 indicates a change in the input susceptance $b = -j Y_\theta \cot(2\pi l/=)$ when the short-circuiting position is shifted in the parallel branched waveguide where $Y_o$ is the admittance of the waveguide. That is to say, when the short-circuiting length l is ¼ of a wavelength $\lambda$ in the waveguide, the input susceptance becomes zero. On the contrary, when the short-circuiting length becomes longer than ¼ of the wavelength in the waveguide, the input susceptance becomes capacitive, and when it becomes shorter than that, the input susceptance becomes inductive with the result that it is added to the load admittance.

Figure 3:
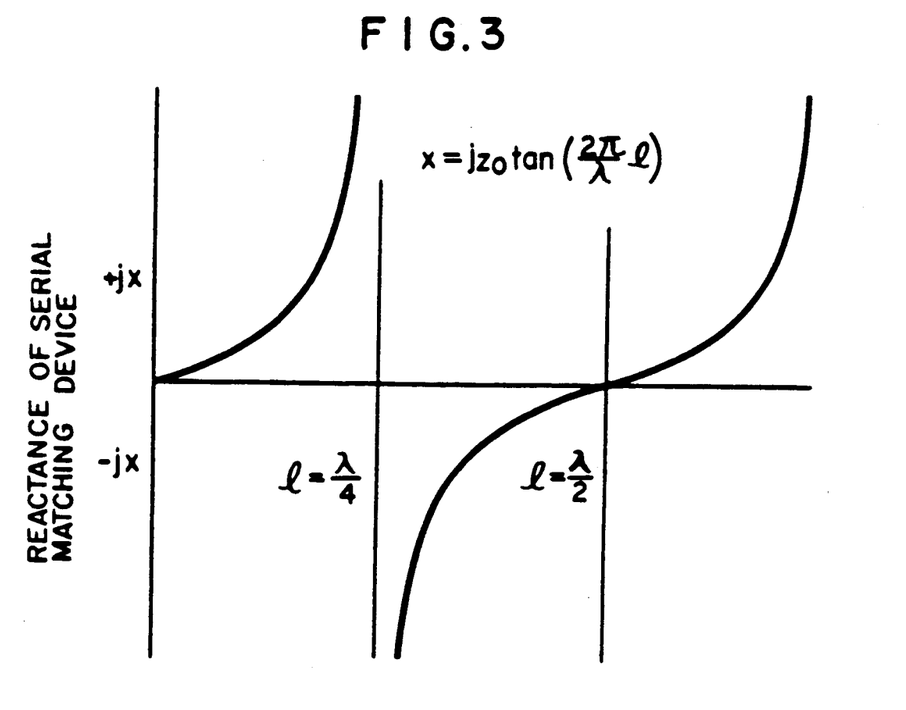
FIG. 3 is also a graphical representation showing reactance variation characteristics of a serial type matching device, on the basis of changes in the short-circuiting length.

Also, the shifting characteristic of the short-plunger in the serially branched waveguide presents, as shown in FIG. 3, an inductive reactance x with the insertion length of from zero to ¼ of a wavelength in the waveguide. Exceeding this range of insertion wavelength, the shifting characteristic thereof indicates the capacitive reactance x, whereby the equivalent reactance becomes zero at a point corresponding to ½ of the wavelength in the waveguide. If the insertion wavelength is longer than ½ of a wavelength in the waveguide, the shifting characteristic again indicates the inductive reactance. In this last case, the equivalent reactance is added to the load impedance.

The above mentioned first embodiment of the matching device is so constructed that, as shown in, for example, FIG. 4, serially or parallelly branched waveguides 6 are attached onto the rectangular waveguide 6 at a space interval corresponding to an odd number multiple of approximately ⅛ of a wavelength in the waveguide, and then three short-plungers 7 are each disposed in the interior of each of the branched waveguides 6, thereby utilizing them as the matching elements. Of these three short-circuiting elements, the two at both ends are so disposed that the short-plungers therein move in mutually opposite directions. That is to say, in the case of the matching element disposed in the parallel branched waveguide, since the phases of both short-plungers are in approximately ¼ of the wavelength in the waveguide, the electric motors are wired so that one of the two short-plungers moves in the forward direction and the other moves in the reverse direction, and they are driven with an output voltage of the cosine product or the sine product. On the other hand, the electric motor for the center matching element is driven with the other output voltage.

Figure 5:
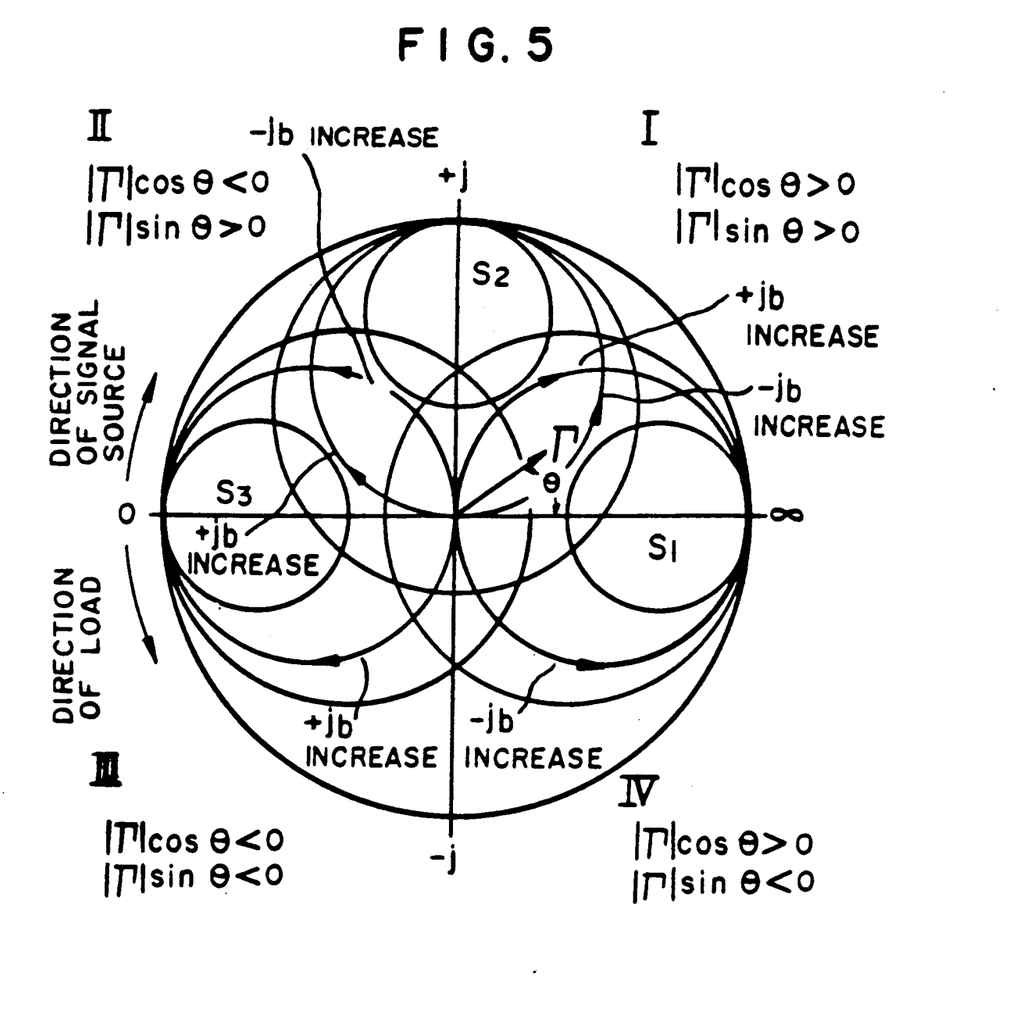
FIG. 5 is a Smith chart showing variations in characteristics of the first type matching device shown in FIG. 4, following movement of each short-plunger thereof.

FIG. 4 schematically illustrates the above-described construction and operating conditions of the matching device, in which the matching elements are arranged from the side of a signal source in the sequence of S1, S2, and S3, each being driven by the electric motors M1, M2, and M3, respectively. In this constructional arrangement, the motors M1 and M3, for example, are driven with the sine product output voltage Vs, while M2 is driven with the cosine product output voltage Vc, and shifting of the short-plunger S1 by the motor M1 is in the direction opposite to the short-plunger S3. Since these three matching elements are spaced apart one after the other at an interval of ⅛ of a wavelength in the waveguide, it will be seen from the Smith chart in FIG. 5 that the short-plunger S1 moves on the line extending from the center of the chart to the infinity (∞), while the short-plunger S2 moves on the locus turned by 90 deg., on the chart, from the infinity point (∞) toward the signal source, and the short-plunger S3 further rotates by 90 deg. in the counter-clockwise direction.

Now assume that these branched waveguides are in parallel, that increase in the sine product voltage Vs reduces the distance ls1 of the short-plunger of the matching element S1, while it increases the distance ls3 of the short-plunger of the matching element S3, and that the distance ls2 of the short-plunger of the center matching element S2 is so set that it augments as the cosine product voltage Vc increases. In such instance, the change in the susceptance each matching element due to increase in the cosine product voltage Vc ad the sine product voltage Vs will be as shown in the following Table, in reference to FIG. 2.

| Increase in Vc | Increase in ls2 | Increase in susceptance |
|---|---|---|
| Increase in Vs | Decrease in ls1 | Decrease in susceptance |
| Increase in Vs | Increase in ls3 | Increase in susceptance |

Figure 6:
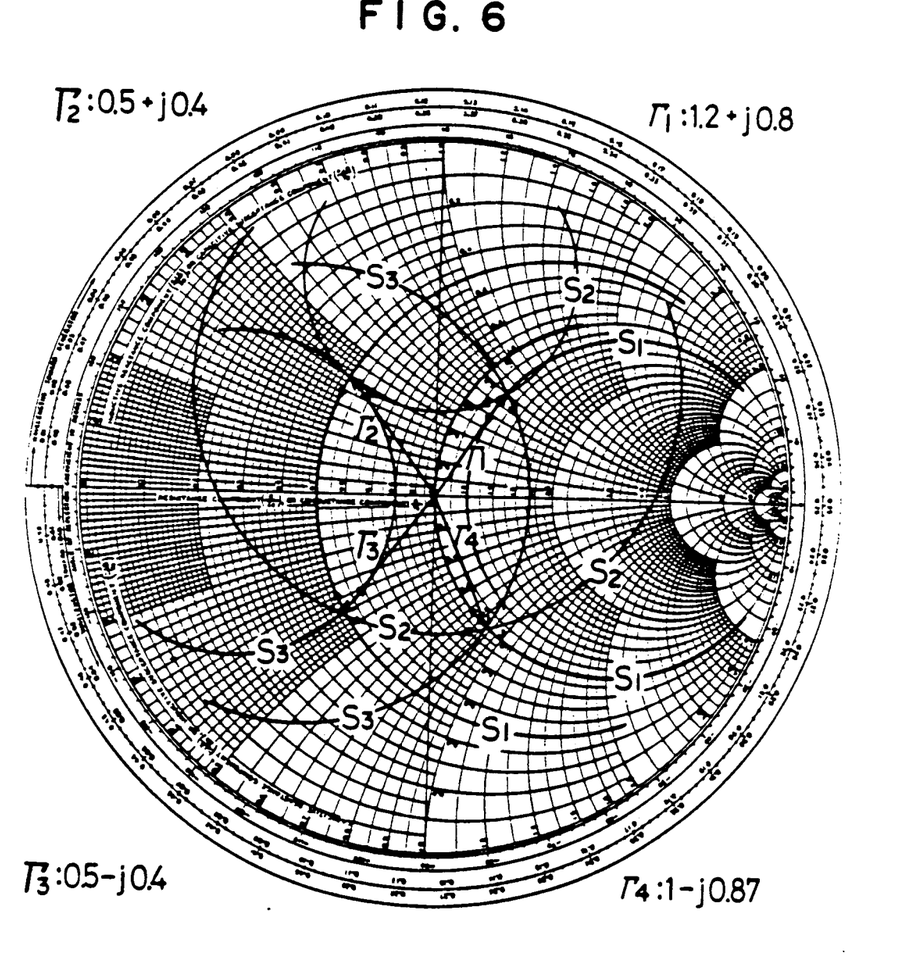
FIG. 6 is an explanatory diagram of the first type matching circuit.

From the above Table, it is now assumed that, in the detection circuit as shown in FIG. 1, the reflection coefficient Γ1 of the load circuit including the matching device was in the first quadrant of FIG. 6, and its normalized admittance was (y=1.2+j0.8). Since, in this first quadrant, the cosine product |Γ1| cos θ and the sine product |Γ1| sin θ are both in the positive values, the distance ls1 of the short-plunger in the matching element S1 decreases, hence the susceptance decreases. Accordingly the susceptance moves on the circle of g=1.2 in FIG. 6 in the decreasing direction from 0.8. On the other hand, the distance ls2 of the center matching element S2 increases, hence the susceptance increases. However, since the Γ1 point on the chart of FIG. 6 is in the negative susceptance region at this matching element S2, it moves in the clockwise direction, i.e., in the direction approaching the matching point. In addition, by its rotation on the matching element S2, the conductance also decreases from g=1.2 to g=1.1.

In addition, the matching element S3 increases the shifting distance ls3 of its short-plunger by the positive value of the sine product voltage Vs, hence its susceptance increases. However, since the Γ1 point is in the negative susceptance region for the matching element S3, it is approaching the matching point, hence the three matching elements cooperate to bring the reflection coefficient |Γ1| to the matched point zero (0), i.e., (1+j0).

Assuming also that the negative reflection coefficient Γ2 was in the second quadrant, and its normalized admittance was (y=0.5+j0.4). In this instance, since the cosine product |Γ| cos θ<0 and the sine product |Γ| sin θ>0, the distance of the short-plunger ls1 decreases, hence the susceptance decreases. As the consequence, the matching element S1 moves on the circle of g=0.5 in the direction where the susceptance decreases, i.e., in the downward direction. Since the matching element S2 is in the positive susceptance region, the distance of its short-plunger ls2 decreases as the cosine product voltage Vc decreases, hence the susceptance decreases. Further, since the matching element S3 is in the negative susceptance region, the distance of its short-plunger ls3 increases as the sine product voltage Vs increases, hence the susceptance increases from the negative susceptance region, and the matching element S3 approaches the matched point. In this instance, the value g also approaches to 1, as will be seen from FIG. 6, and it finally arrives at the matched point of |Γ|=0, i.e., y=1+j0, following the movements of the matching elements S2 and S3.

Similarly, with respect to the load in the third and fourth quadrants, these three matching elements start to shift on their short-circuiting points at the same time with two kinds of voltage, i.e., the cosine product voltage Vc and the sine product voltage Vs, thereby quickly reaching their matched point.

Figure 7:
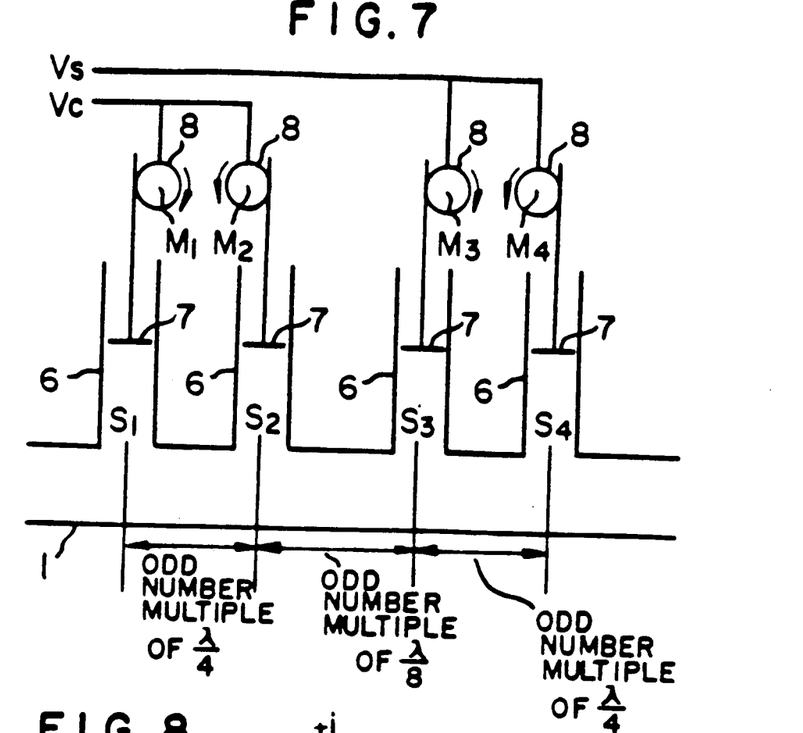
FIG. 7 is a schematic circuit diagram showing the construction of the second type matching device according to the present invention.

In the second embodiment shown in FIG. 7, it is assumed that the short-plungers 7 are each inserted into the parallel or serially branched waveguides 6 disposed on the rectangular waveguide 1, at a distance corresponding to an odd number multiple of ¼ of a wavelength in the waveguide, and the short-plungers are shifted in the mutually opposite directions, in reference to a point in the vicinity of the susceptance zero or reactance zero, as the center of shifting. In this instance, an immitance IM, viewing the load side at the point of the matching element S1 to the side of the signal source is represented by the following equation, with the real number part being "a" and the imaginary number part being "b":

$$IM = \frac{1}{a \pm jb} \mp jb = \frac{a}{a^2 + b^2} \mp jb \left( \frac{1}{a^2 + b^2} + 1 \right)$$

Figure 8:
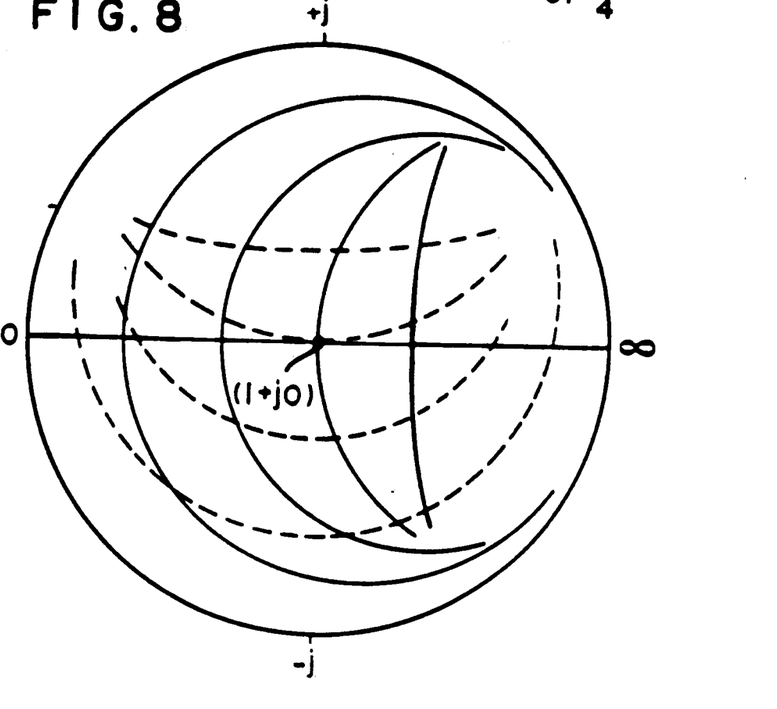
FIG. 8 is an explanatory diagram for the operation of the second type matching device shown in FIG. 7.

This equation can be illustrated with a group of solid lines, as in FIG. 8, wherein circles are stretched in its upper and lower directions on the Smith chart. Further, since a pair of matching elements S3 and S4, which are closer to the load side by a distance corresponding to an odd number multiple of ⅛ of a wavelength in the waveguide, is shifted by 90 deg., on the same Smith chart, from another pair of matching elements S1 and S2, it can be indicated by a group of dotted lines in FIG. 8. As the consequence, when one pair of the matching elements are driven by the cosine product voltage and the other pair thereof are driven by the sine product voltage, they can readily arrive at the matched point, i.e., (1+j0), since the change in both drive voltages and both shifting points are all in a relationship of the right angle. This is the function of the above-described second embodiment of the matching device according to the present invention.

Figure 9:
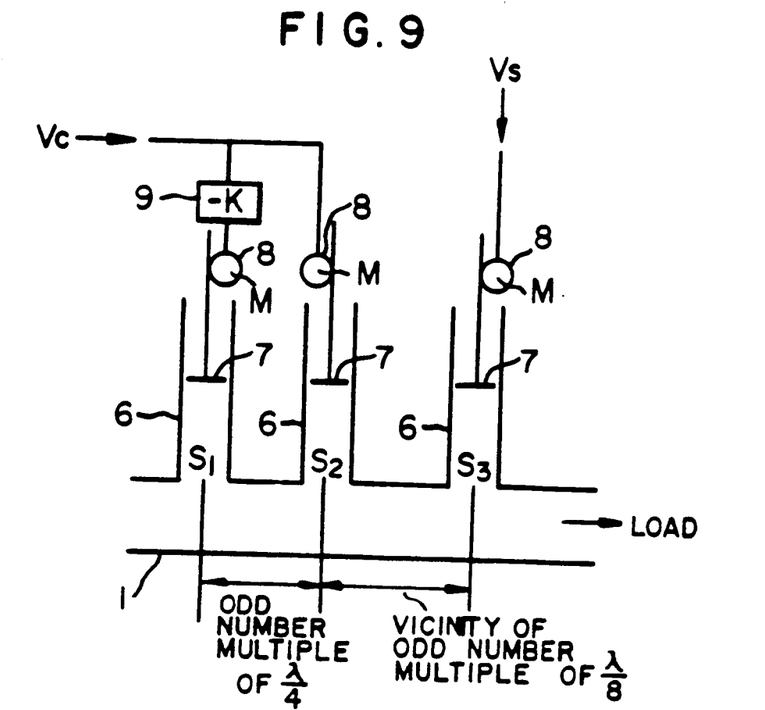
FIG. 9 is a schematic circuit diagram showing the construction of the third type matching device according to the present invention.

In the same manner as mentioned above, the third embodiment of the matching device according to the present invention is constructed so that, as shown in FIG. 9, the short-plungers 7 are each inserted into the parallel or serially branched waveguides 6 disposed on the rectangular waveguide, at a distance corresponding to an odd number multiple of ¼ of a wavelength in the waveguide, and the short-plungers are shifted in the mutually opposite directions, in reference to a point in the vicinity of the susceptance zero or reactance zero, as the center of shifting. In this case, the short-plungers are shifted in the mutually opposite directions by use of an inverting circuit 9 for one of the matching devices, or by setting the shifting distance of the short-plunger thereof at a value of K times (K<1) from the standpoint of its mechanism. With this construction, an immitance IM, viewing the load side at a point of the matching element S1 to the side of the signal source is represented by the following equation, with the real number part being "a" and the imaginary number part being "b":

$$IM = \frac{1}{1 \pm jb} \mp jKb = \frac{1}{1 + b^2} \mp jb \left( \frac{1}{1 + b^2} + K \right)$$

Figure 10:
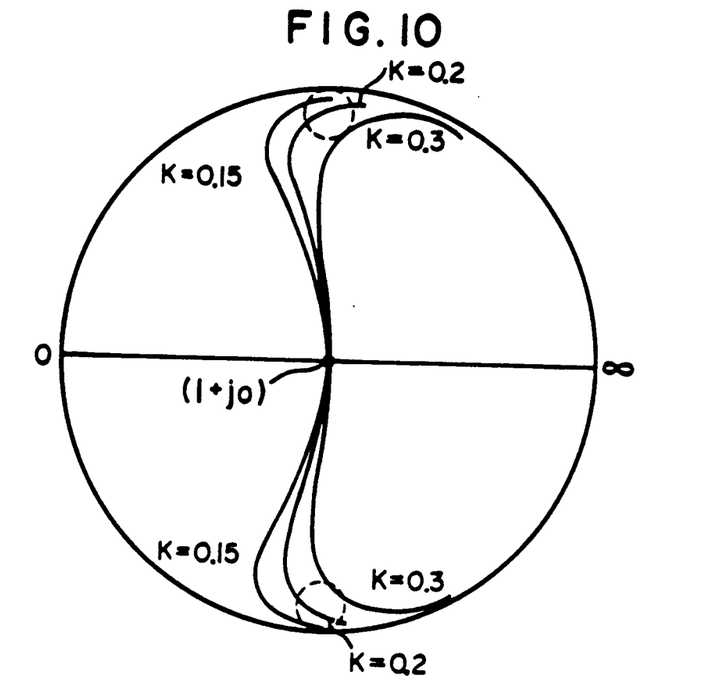
FIG. 10 is an explanatory diagram for the operation of the third type mtching device shown in FIG. 9.

In this case, changes in the characteristics, when K is set at 0.15, 0.2 and 0 3, passes through the point (1+j0) and are arranged substantially at the right angle with respect to the diametral line (0 ~ ∞) as shown in FIG. 10. Accordingly, in the circuit of FIG. 9, where a third matching element is disposed at a space interval corresponding to an odd number multiple of ⅛ of a wavelength in the waveguide, in comparison with the arrangement of these two matching elements, even those small circles shown in dotted line in FIG. 10 intersect with the characteristic curves having the value of K=0.15~0.3. Therefore, when one of the short-plunger is shifted from its short-circuiting point by the electric motor with the cosine product output voltage, and the other is shifted with the sine product output voltage, the automatic matching can be done over the substantially entire region.

As has so far been explained in the foregoing, the present invention has made it possible to provide an automatic load matching circuit for matching over the entire region. In more detail, by detecting the reflected wave from the load circuit including the matching device, with which to find the cosine product voltage $|\Gamma| \cos \theta$ and the sine product voltage $|\Gamma| \sin \theta$, it becomes possible to drive, for examples, two sets of the multi-element matching device, whereby the full automatic load matching becomes possible. The response speed of the matching device according to the present invention indicated satisfactory results with respect to abrupt changes in the load in its ordinary use. For instance, when a load of VSWR 10 was connected to the matching device at a frequency of 2.45 GHz, the matching circuit using the abovementioned first, second and third type matching devices could perform their matching operation of VSWR 1.05 or less within one second. By the way, it should be noted that similar result was obtained even in a coaxial tube circuit having parallelly branched matching devices.

Although, in the foregoing, the present invention has been described with specific reference to the preferred embodiments thereof, it should be understood that these embodiments are merely illustrative of the present invention, and not so restrictive, and that any changes and modifications in the circuit construction can be made by those persons skilled in the art without departing from the spirit and scope of the invention as recited in the appended claims.

We claim:

1. An automatic load-matching circuit for microwaves, disposed on a transmission line between a signal source and a load, comprising:

signal detection means for detecting a wave component traveling into the automatic load-matching circuit toward the load, for detecting a wave component reflected from the load having a reflection coefficient $\Gamma$ and deflection angle $\theta$, and for producing outputs corresponding to the absolute value of reflection coefficient $\Gamma$, a cosine product $|\Gamma| \cos \theta$, and a sine product $|\Gamma| \sin \theta$; and automatic matching means controlled by the outputs of the signal detection means, including three matching elements, each having an adjustable short-circuiting length, disposed on the transmission line such that distances corresponding to odd number multiples of ⅛ of a wavelength along the transmission line separate the matching elements from each other, a second of the matching elements being disposed between a first and third of the matching elements, the first and third matching elements being connected such that in response to a change in the short-circuiting length of one of the first and third matching elements, the shortcircuiting length of the other of the first and third matching elements changes in a corresponding opposite manner, the first and third matching elements both being driven by one of either the cosine product output or the sine product output and the second matching element being driven with the one of the sine and cosine product outputs not driving the first and third matching elements.

2. An automatic load-matching circuit for microwaves, disposed on a transmission line between a signal source and a load, comprising:

signal detection means for detecting a wave component traveling into the automatic load-matching circuit toward the load, for detecting a wave component reflected from the load having a reflection coefficient $\Gamma$ and deflection angle $\theta$, and for producing outputs corresponding to the absolute value of reflection coefficient $\Gamma$, a cosine product $|\Gamma| \cos \theta$, and a sine product $|\Gamma| \sin \theta$; and automatic matching means controlled by the outputs of the signal detection means, including two or more pairs of matching elements, the matching elements of each pair being disposed on the transmission line such that distances corresponding to odd number multiples of about $\frac{1}{4}$ of a wavelength along the transmission line separate the matching elements in each pair, each of the matching elements having an adjustable short-circuiting length and the pair of matching elements being connected such that in response to a change in the short-circuiting length of one of the matching elements in a pair, the short-circuiting length of the other of the matching elements in that pair changes in a corresponding opposite manner, the two or more pairs of matching elements being disposed on the transmission line such that distances corresponding to odd number multiples of about $\frac{1}{8}$ of a wavelength along the transmission line separate the nearest matching elements of adjacent pairs, one of the pairs of matching elements being driven by the cosine product output and the other of the pairs being driven by the sine product output.

3. An automatic load-matching circuit for microwaves, disposed on a transmission line between a signal source and a load, comprising:

signal detection means for detecting a wave component traveling into the automatic load-matching circuit toward the load and for detecting a wave component reflected from the load having a reflection coefficient $\Gamma$ and deflection angle $\theta$, and producing outputs corresponding to the absolute value of reflection coefficient $\Gamma$, a cosine product $|\Gamma| \cos \theta$, and a sine product $|\Gamma| \sin \theta$; and automatic matching means controlled by the outputs of the signal detection means, including a pair of matching elements disposed on the transmission line such that a distance corresponding to an odd number multiple of approximately $\frac{1}{4}$ of a wavelength along the transmission line separates the matching elements in the pair from each other, the matching elements, each having a short-circuiting length, being connected in such a manner that in response to a change in the short-circuiting length of one of the matching elements in the pair the short-circuiting length of the other matching element of the pair changes in an opposite manner, and a third matching element disposed on the transmission line between the pair and the load at a distance from the nearest matching element of the pair corresponding to an odd number multiple of $\frac{1}{8}$ of a wavelength along the transmission line, the pair of matching elements both being driven by one of either the cosine product output or the sine product output, and the third matching element being driven by the one of the sine product output and the cosine product not driving said pair.

* * * * *